United States Patent
Yaung et al.

(10) Patent No.: US 7,479,403 B2
(45) Date of Patent: Jan. 20, 2009

(54) PINNED PHOTODIODE INTEGRATED WITH TRENCH ISOLATION AND FABRICATION METHOD

(75) Inventors: Dun-Nian Yaung, Taipei (TW); Sou-Kuo Wu, Hsinchu (TW); Ho-Ching Chien, Hsinchu (TW); Chien-Hsien Tseng, Hsinchu (TW); Jeng-Shyan Lin, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 173 days.

(21) Appl. No.: 11/488,611

(22) Filed: Jul. 19, 2006

(65) Prior Publication Data

US 2006/0270091 A1 Nov. 30, 2006

Related U.S. Application Data

(62) Division of application No. 10/918,417, filed on Aug. 16, 2004, now Pat. No. 7,145,190.

(51) Int. Cl.
*H01L 21/00* (2006.01)

(52) U.S. Cl. .................... 438/57; 257/292

(58) Field of Classification Search ............ 438/57, 438/59, 296; 257/292
See application file for complete search history.

(56) References Cited

U.S. PATENT DOCUMENTS

| | | | |
|---|---|---|---|
| 6,329,679 B1 | 12/2001 | Park | |
| 6,372,603 B1 * | 4/2002 | Yaung et al. | 438/424 |
| 6,723,580 B2 | 4/2004 | Park | |
| 7,145,190 B2 * | 12/2006 | Yaung et al. | 257/233 |
| 2005/0062078 A1 | 3/2005 | Han | |
| 2005/0133837 A1 | 6/2005 | Hsu et al. | |

* cited by examiner

*Primary Examiner*—Mark Prenty
(74) *Attorney, Agent, or Firm*—Birch, Stewart, Kolasch & Birch, LLP

(57) ABSTRACT

A photo sensor with pinned photodiode structure integrated with a trench isolation structure. The photo sensor includes a substrate of a first conductivity type, at least one trench in the substrate, at least one doped region of the first conductivity type, and at least one doped region of a second conductivity type. Each doped region of the first conductivity type is beneath a corresponding trench. Each doped region of the second conductivity type is sandwiched between the corresponding doped region and the substrate of the first conductivity type. No edge of any doped region of the first or second conductivity type extends to the trench corners. A method of fabricating the photo sensor is also provided.

20 Claims, 7 Drawing Sheets

PINNED PHOTODIODE INTEGRATED WITH TRENCH ISOLATION AND FABRICATION METHOD

This application is a Divisional of U.S. application Ser. No. 10/918,417, now U.S. Pat. No. 7,145,190, filed on Aug. 16, 2004, the entire contents of which are hereby incorporated by reference and for which priority is claimed under 35 U.S.C. § 120.

BACKGROUND

The present invention relates in general to a photodiode structure, and more particularly to a pinned photodiode integrated with a trench isolation structure.

Recently, NPS (N-type photo sensor)/P-sub photodiodes formed under STI (shallow trench isolation) regions have been widely used due to their low dark current and high quantum efficiency. Conversely, pinned photodiode structures are used to improve dark current and blue(short wavelength) response, by forming a buried junction near the surface of the substrate, in conventional image sensors.

As is well-known to those skilled in the art, the pinned photodiode (PPD) has been widely used as an element to produce and integrate photoelectric charge generated in image sensors when detecting light from an object. These are also referred to as "buried photodiodes" as they comprise a PNP (or NPN) junction structure buried in a substrate. When compared with photodiodes of other structures, the PPD has various advantages, among them is an increased depletion depth which produces high quantum efficiency during conversion of incident photons into electric charges. That is, in a PPD comprising a PNP junction structure, the N-type region is fully depleted and the depletion region extends to both P-type regions with an increased depletion depth. Accordingly, this vertical extension of the depletion depth may increase quantum efficiency, thereby enabling an excellent light sensitivity.

The pinned photodiode structure, however, is not compatible with conventional STI technology due to the difficulty of controlling the formation of a shallow source/drain junction and the inability to cover the STI corner in the conventional process.

SUMMARY

An embodiment of the invention provides a pinned photodiode structure integrated with a trench isolation structure. The pinned photodiode provides improved dark current and blue response.

An embodiment of the invention provides a photo sensor with a pinned photodiode structure integrated with a trench isolation structure. The photo sensor comprises a substrate of a first conductivity type, at least one trench in the substrate, at least one doped region of the first conductivity type, and at least one doped region of a second conductivity type. Each doped region of the first conductivity type is formed beneath the corresponding trench. Each doped region of the second conductivity type is sandwiched between the corresponding doped region and the substrate of the first conductivity type. No edge of any doped region of the first or second conductivity types extends to the trench corners.

Another embodiment of the invention provides a fabricating method of a photo sensor with a pinned photodiode structure integrated with a trench isolation structure. The fabricating method comprises forming a substrate of a first conductivity type, forming at least one trench in the substrate, forming at least one doped region of the first conductivity type, and forming at least one doped region of a second conductivity type. Each doped region of the first conductivity type is formed beneath the bottom of the corresponding trench. Each doped region of the second conductivity type is sandwiched between the corresponding doped region and the substrate of the first conductivity type. No edge of any doped region of the first or second conductivity types extends to the trench corners.

The pinned photodiode structure provided by embodiments of the invention is integrated with a trench isolation structure. The pinned photodiode structure is located away from the trench corners with high trap density and dark current is thereby improved. Additionally, short wavelength photo response is also improved through use of the pinned photodiode structure.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION

The construction of a photo sensor according to the embodiments of the invention is described below. While the embodiments are directed to an NPN pinned photodiode structure, the embodiments also are applicable to a PNP pinned photodiode structure.

Figure 1:
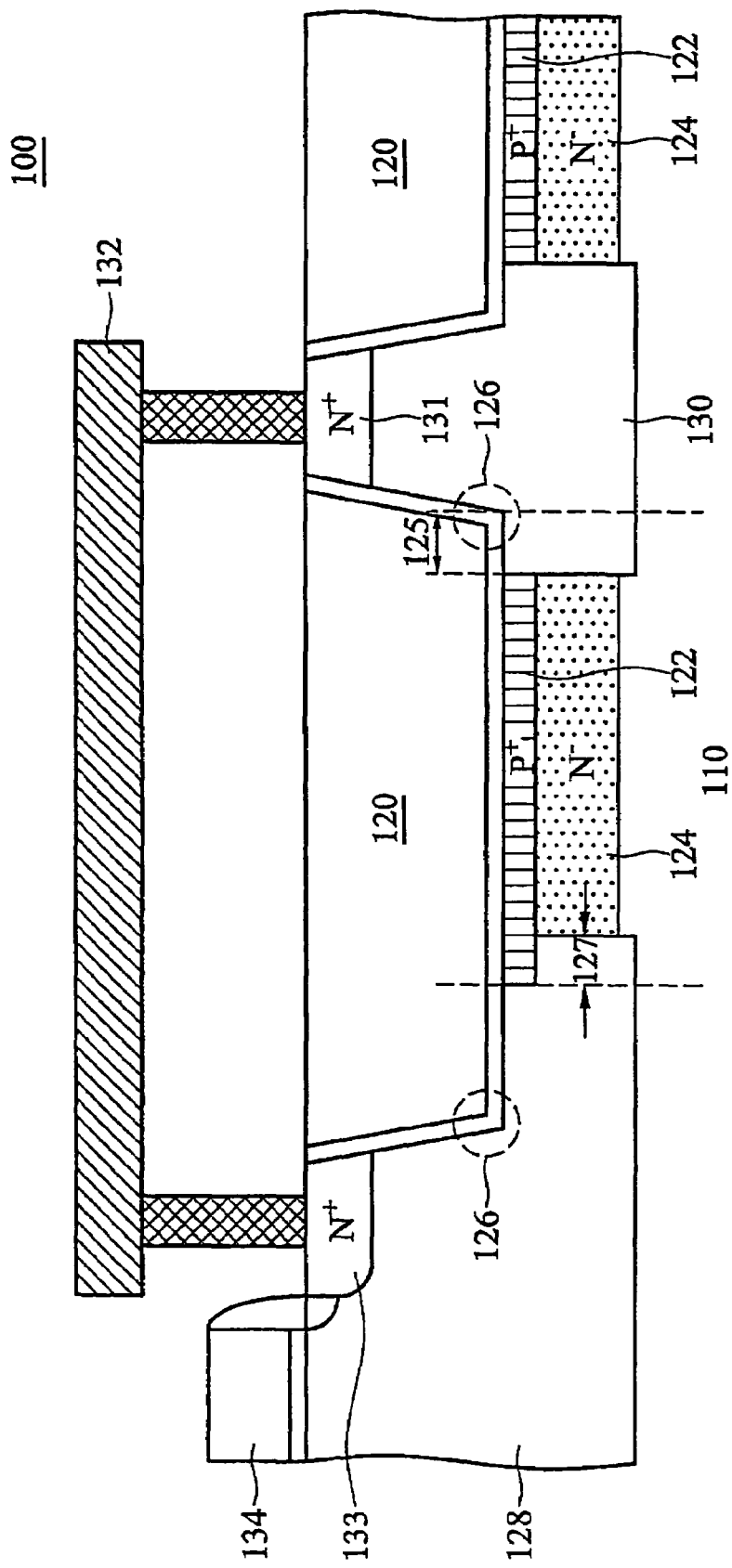
FIG. 1 illustrates a photo sensor according to an embodiment of the invention.

FIG. 1 illustrates a photo sensor according to an embodiment of the present invention. The photo sensor 100 comprises a P-type substrate 110, with at least one trench 120 formed therein, at least one heavily doped P-type region 122, and at least one lightly doped N-type region 124. Each heavily doped P-type region 122 is located beneath the corresponding trench 120 and contacts the corresponding trench 120. Each lightly doped N-type region 124 is sandwiched between the corresponding heavily doped P-type region 122 and the P-type substrate 110. No edge of any heavily doped P-type region 122 or lightly doped N-type region 124 extends to the trench corner 126. More specifically, the distance 125 from one edge of the doped region to the corresponding trench corner 126 is in the range between 0.1 and 0.3 µm. Since even after thermal annealing, there are some dislocations around the trench corners 126. Overlap between the PNP pinned photodiode structure and the trench corners 126 is avoided to reduce dark current. Furthermore, as shown in FIG. 1, part of the heavily doped P-type region 122 is not overlapped by the corresponding lightly doped N-type region 124. More specifically, the extension 127 from one edge of the lightly doped N-type region 124 to the corresponding edge of the heavily doped P-type region 122 is in the range between 0.1 and 0.3 µm. A P-well 128 is coupled to the heavily doped P-type region 122, to provide a bias voltage thereto, via the extension 127. Conversely, an N-well 130 is coupled to the lightly doped N-type region 124. The charges generated in the depletion region in the lightly doped N-type region 124 are collected by the N-well 130. The charges are then transferred to the source/drain region 133 of the transfer transistor 134 via the heavily doped N-type region 131 and a metal interconnection 132.

Figure 2:
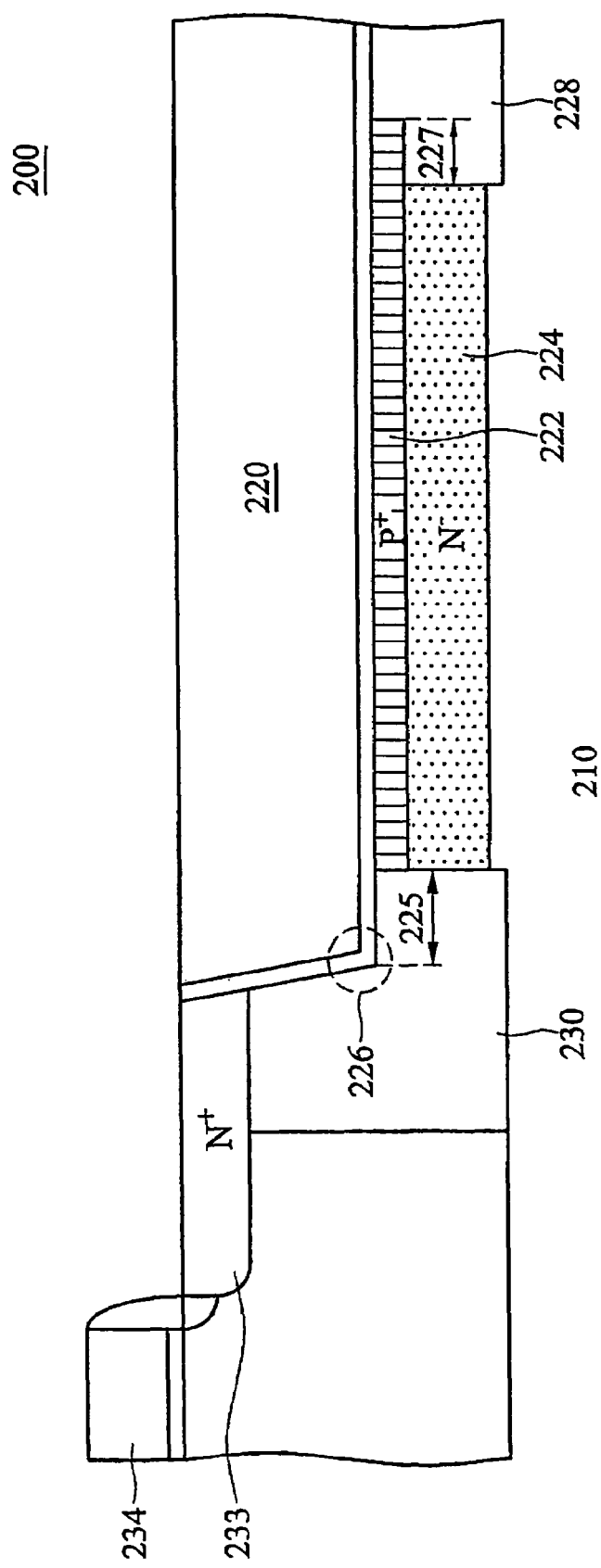
FIG. 2 illustrates a photo sensor according to another embodiment of the invention.

FIG. 2 illustrates another embodiment of a photo sensor. The photo sensor 200 comprises a P-type substrate 210, at least one trench 220 in the P-type substrate 210 and at least one P+/N− junction. Each P+/N− junction is located beneath the corresponding trench 220. Each lightly doped N-type region is sandwiched between the corresponding P-type heavily doped region and the P-type substrate 210. No edge of any heavily doped P-type region or lightly doped N-type region extends to the trench corner 226. More specifically, the distance 225 from one edge of the doped region to the corresponding trench corner 226 is in the range between 0.1 and 0.3 μm. As shown in FIG. 2, part of the heavily doped P-type region 222 is not overlapped by the lightly doped N-type region 224. More specifically, the distance 227 from one edge of the N-type lightly doped region to the corresponding edge of the P-type lightly doped region is in the range between 0.1 and 0.3 μm. A P-well 228 is coupled to the P-type heavily doped region, to provide a bias voltage thereto, via the extension 227. Conversely, an N-well 230 is coupled to the lightly doped N-type region. Any charge generated in the depletion region in the lightly doped N-type region is collected by the N-well 230. The charge is then transferred to the source/drain region 233 of the transfer transistor 234.

Figure 3A:
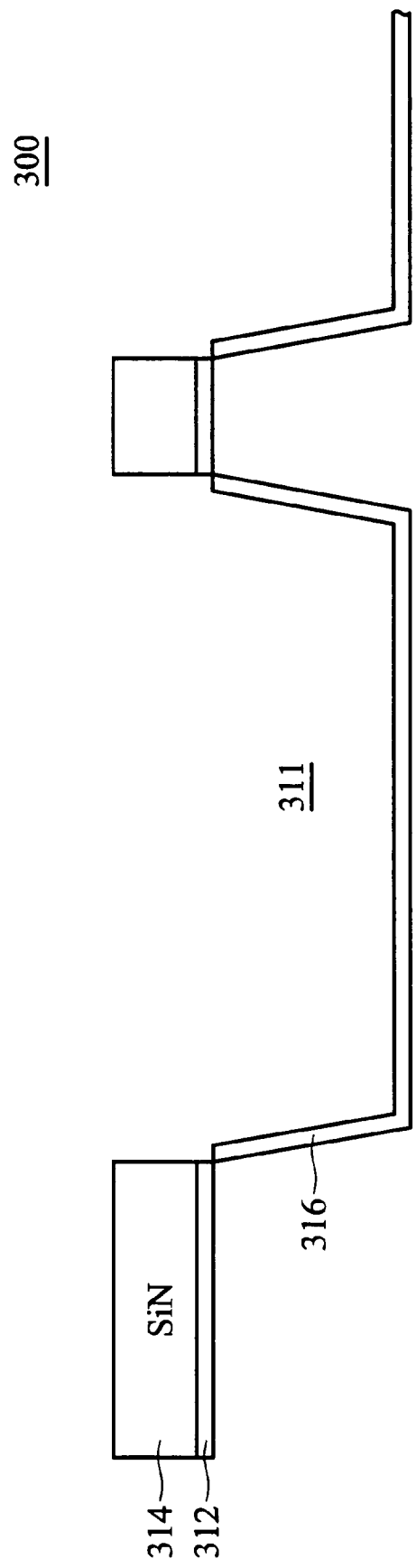
FIGS. 3A~3E collectively illustrate the fabrication of a photo sensor according to one preferred embodiment of the present invention.
Figure 3B:
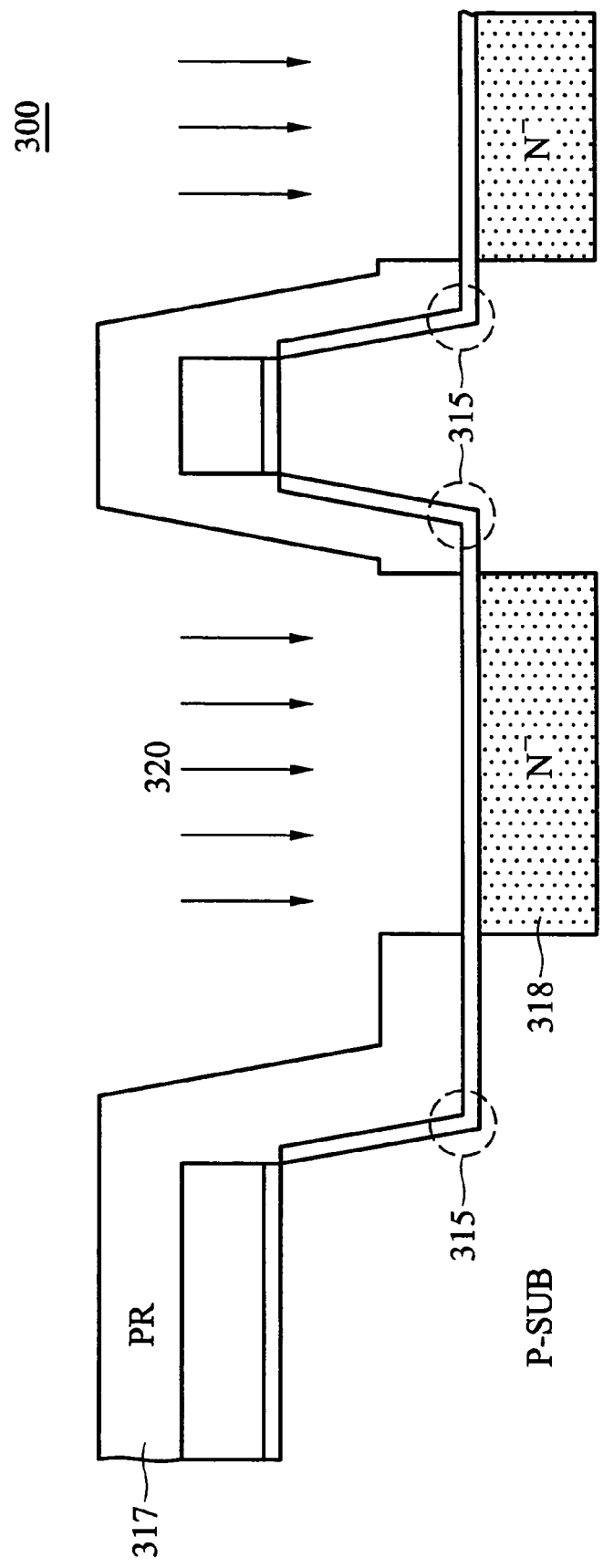
Figure 3C:
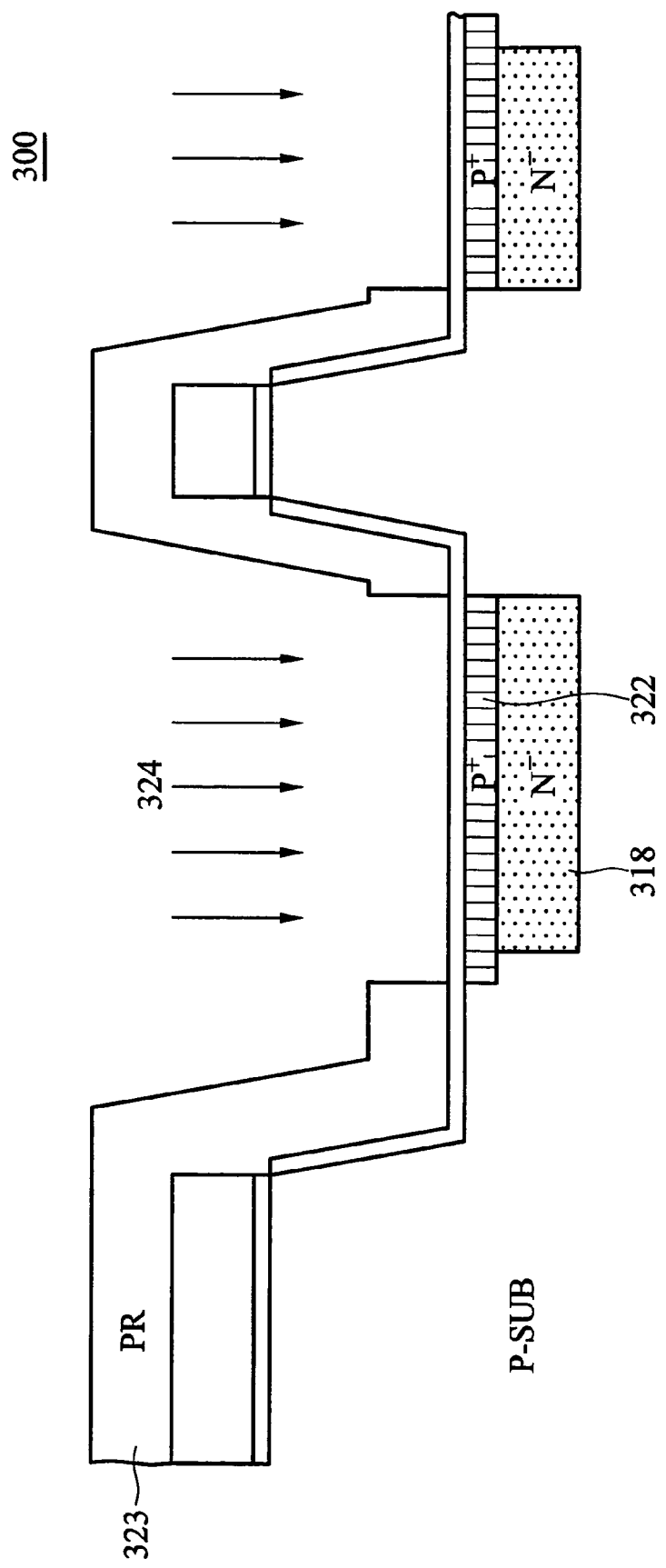
Figure 3D:
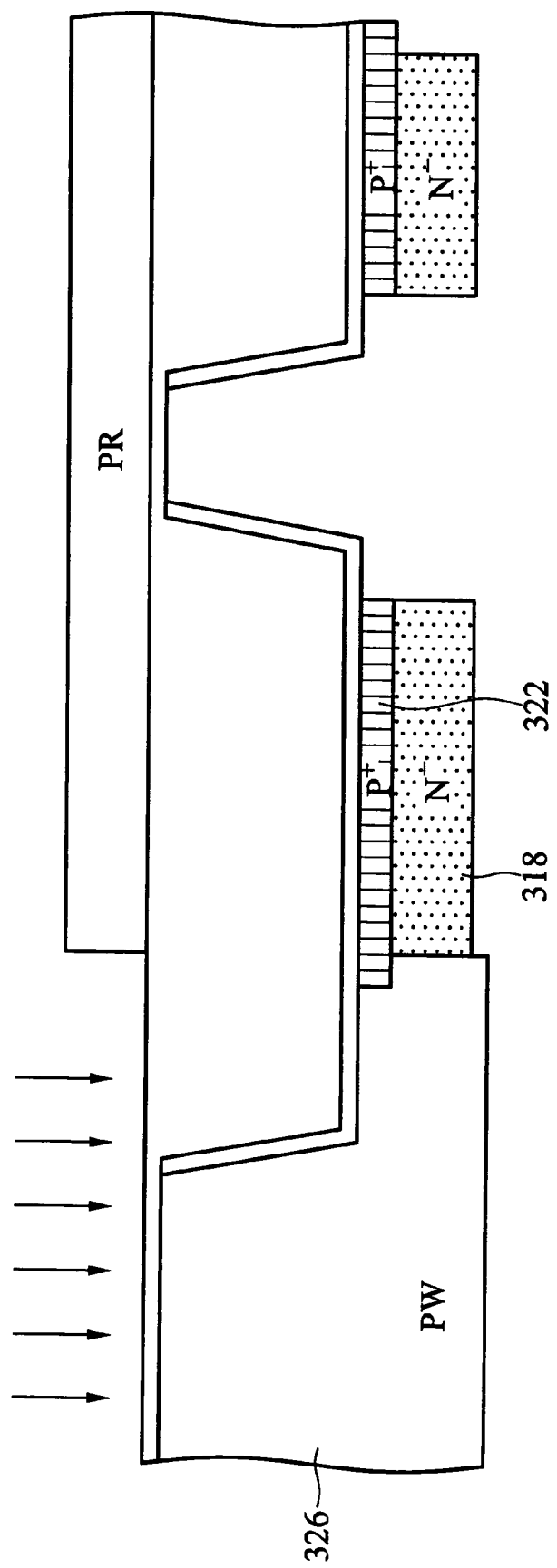
Figure 3E:
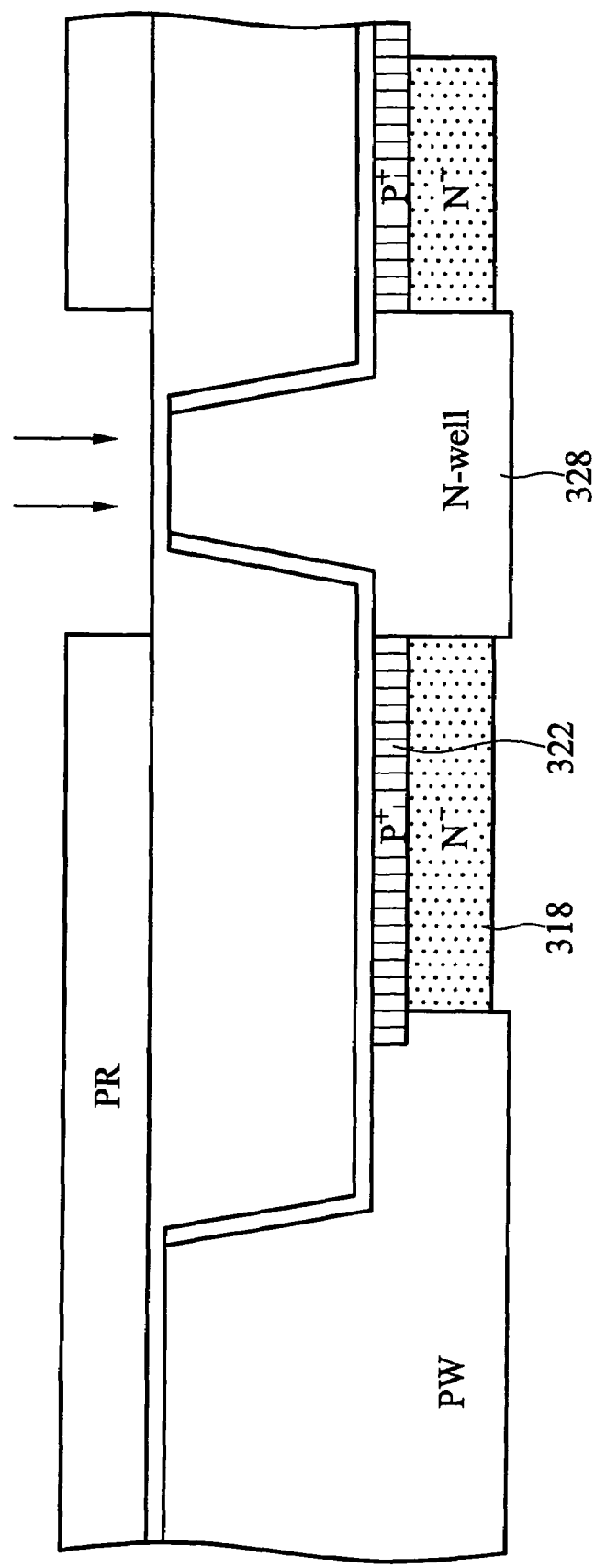

FIGS. 3A–3E collectively illustrate an embodiment of fabrication of a photo sensor. First, at least one trench 311, defined by a pad oxide 312 and a pad nitride 314, is formed by dry etching a P-type substrate 300, as shown in FIG. 3A. A lining oxide 316 is preferably formed by dry oxidation to reduce surface damage to the trench 311. Subsequently, a photolithography process and an ion implantation process are performed, as shown in FIG. 3B. A photoresist layer 317 masks the pad oxide/nitride layer and all sidewalls of the trench 311. The trench corners 315 are also covered by the photo resist layer 317. A lightly doped N-type region 318 is formed in the P-type substrate 300 by ion implantation 320. Following the formation of the lightly doped N-type region 318, photolithography and ion implantation processes are again performed, as shown in FIG. 3C. The opening in the photoresist layer 323 is larger than that of the photoresist layer 317. Another ion implantation process is performed to form a heavily doped P-type region 322 in the P-type substrate 300. In FIG. 3C, the lightly doped N-type region 318 is sandwiched between the heavily doped P-type region 322 and the P-type substrate 300. Furthermore, no part of the P-type heavily doped region 322 overlaps the lightly doped N-type region 318. Subsequent to the formation of the PNP pinned photodiode structure, an isolation dielectric is filled in the trench and etched back by a chemical mechanical polishing (CMP) process. Thereafter, a P-well formation process compatible with a standard logic process is performed, as shown in FIG. 3D. The P-well 326 formed by a lithography and ion implantation process is coupled to the heavily doped P-type region 322 for providing a bias voltage thereto during operation. Similarly, following formation of the P-well 326, an N-well formation process compatible with a standard logic process is performed, as shown in FIG. 3E. The N-well 328 formed by a lithography and ion implantation process is coupled to the lightly doped N-type region 318 for providing a bias voltage thereto during operation. Finally, a standard logic process can be used to form transistors to implement sensor circuits in an active pixel sensor.

The described embodiments provide a pinned photodiode structure integrated with a trench isolation structure. The pinned photodiode structure is located away from the trench corners with high trap density, thus dark current is improved. Additionally, short wavelength photo response is also improved through use of the pinned photodiode structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a photo sensor, comprising:
    forming at least one trench in a substrate of a first conductivity type;
    forming at least one doped region of the first conductivity type contacting and underneath the bottom of a corresponding trench; and
    forming at least one doped region of a second conductivity type sandwiched between the corresponding doped region of the first conductivity type and the substrate;
    wherein the trench laterally extends beyond both edges of each doped region of the first and second conductivity types, such that the both edges are separated from the bottom corners of the trench and the bottom corners of the trench are at the substrate outside the doped regions of the first and second conductivity types.

2. The method as claimed in claim 1, wherein the distance from either edge of each doped region of the first conductivity type and the second conductivity type to the trench corner is in the range of 0.1 to 0.3 μm.

3. The method as claimed in claim 1, wherein part of at least one of the doped regions of the first conductivity type is not overlapped by the corresponding doped region of the second conductivity type.

4. The method as claimed in claim 3, wherein the distance from any edge of the doped region of the first conductivity type to a corresponding edge of the doped region of the second conductivity type is in the range of 0.1 to 0.3 μm.

5. The method as claimed in claim 1, further comprising forming a well of the first conductivity type, the well of the first conductivity type coupled to the doped region of the first conductivity type, and forming a well of the second conductivity type, the well of the second conductivity type coupled to the doped region of the second conductivity type.

6. The method as claimed in claim 5, further comprising forming a transfer transistor with source/drain regions of the second conductivity type.

7. The method as claimed in claim 6, wherein the well of the second conductivity type is coupled to the source/drain regions of the transfer transistor.

8. The method as claimed in claim 1, wherein the at least one trench in the substrate of the first conductivity type is defined by at least one pad dielectric layer and is formed by dry etching the substrate of the first conductivity type.

9. The method as claimed in claim 1, further comprising forming a lining oxide on the surface of the trench.

10. A method for fabricating a photo sensor, comprising:
    forming at least one trench in a substrate of a first conductivity type;
    forming at least one doped region of the first conductivity type underneath the bottom of a corresponding trench; and
    forming at least one doped region of a second conductivity type sandwiched between the corresponding doped region of the first conductivity type and the substrate;

wherein both edges of each doped region of the first and second conductivity types are separated from the bottom corners of the trench;

wherein the distance from either edge of each doped region of the first conductivity type and the second conductivity type to the trench corner is in the range of 0.1 to 0.3 µm.

11. The method as claimed in claim 10, wherein part of at least one of the doped regions of the first conductivity type is not overlapped by the corresponding doped region of the second conductivity type.

12. The method as claimed in claim 10, further comprising forming a well of the first conductivity type, the well of the first conductivity type coupled to the doped region of the first conductivity type, and forming a well of the second conductivity type, the well of the second conductivity type coupled to the doped region of the second conductivity type.

13. The method as claimed in claim 10, wherein the at least one trench in the substrate of the first conductivity type is defined by at least one pad dielectric layer and is formed by dry etching the substrate of the first conductivity type.

14. The method as claimed in claim 10, further comprising forming a lining oxide on the surface of the trench.

15. A method for fabricating a photo sensor, comprising:

forming at least one trench in a substrate of a first conductivity type;

forming at least one doped region of the first conductivity type underneath the bottom of a corresponding trench;

forming at least one doped region of a second conductivity type sandwiched between the corresponding doped region of the first conductivity type and the substrate;

forming a well of the first conductivity type, the well of the first conductivity type coupled to the doped region of the first conductivity type; and forming a well of the second conductivity type, the well of the second conductivity type coupled to the doped region of the second conductivity type;

wherein both edges of each doped region of the first and second conductivity types are separated from the bottom corners of the trench.

16. The method as claimed in claim 15, wherein part of at least one of the doped regions of the first conductivity type is not overlapped by the corresponding doped region of the second conductivity type.

17. The method as claimed in claim 15, further comprising forming a transfer transistor with source/drain regions of the second conductivity type.

18. The method as claimed in claim 17, wherein the well of the second conductivity type is coupled to the source/drain regions of the transfer transistor.

19. The method as claimed in claim 15, wherein the at least one trench in the substrate of the first conductivity type is defined by at least one pad dielectric layer and is formed by dry etching the substrate of the first conductivity type.

20. The method as claimed in claim 15, further comprising forming a lining oxide on the surface of the trench.

\* \* \* \* \*